United States Patent
Gaither (10) Patent No.: US 7,685,340 B1
(45) Date of Patent: *Mar. 23, 2010

(54) METHOD AND SYSTEM FOR PROGRAMMABLE INPUT/OUTPUT TRANSCEIVER WHEREIN TRANSCEIVER IN CONFIGURABLE TO SUPPORT A PLURALITY OF INTERFACE STANDARDS

(75) Inventor: Justin L. Gaither, Austin, TX (US)

(73) Assignee: XILINX, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/145,294

(22) Filed: Jun. 24, 2008

Related U.S. Application Data (62) Division of application No. 10/754,683, filed on Jan. 9, 2004, now Pat. No. 7,398,341.

(51) Int. Cl.
*G06F 3/00* (2006.01)
*H04B 1/38* (2006.01)
*H04M 9/00* (2006.01)

(52) U.S. Cl. .............. 710/69; 710/1; 710/11; 710/14; 710/63; 710/71; 713/176; 713/201; 370/338; 370/463

(58) Field of Classification Search ............ 710/1, 710/11, 14, 63, 69, 71; 713/176, 201; 370/338, 370/463
See application file for complete search history.

(56) References Cited

U.S. PATENT DOCUMENTS

| | | | |
|---|---|---|---|
| 6,597,727 B2 * | 7/2003 | Philips et al. ............ 375/147 |
| 6,911,840 B1 * | 6/2005 | Milne et al. ............. 326/38 |
| 7,061,450 B2 * | 6/2006 | Bright et al. ............ 345/7 |
| 7,068,071 B1 * | 6/2006 | Milne et al. ............. 326/41 |
| 7,092,375 B2 | 8/2006 | Pitsoulakis |
| 7,142,557 B2 | 11/2006 | Dhir et al. |
| 7,356,042 B2 | 4/2008 | Ethridge et al. |
| 7,440,572 B2 * | 10/2008 | Dellmo et al. ............ 380/270 |
| 2002/0094087 A1 | 7/2002 | Dellmo et al. |
| 2005/0114710 A1 | 5/2005 | Cornell et al. |
| 2006/0236111 A1 | 10/2006 | Bodensjo et al. |

OTHER PUBLICATIONS

U.S. Appl. No. 10/754,683, filed Jan. 9, 2004, Gaither, Justin L., "Method and System for Programmable Input/Output Transceiver Wherein Transceiver is Configurable to Support a Plurality of Interface Standards", Xilinx, Inc. 2100 Logic Drive, San Jose, CA 95124.

U.S. Appl. No. 10/661,016, filed Sep. 11, 2003, Groen, Eric D., "Programmable Logic Device Including Programmable Multi-Gigabit Transceivers", Xilinx, Inc. 2100 Logic Drive, San Jose, CA 95124.

\* cited by examiner

*Primary Examiner*—Tammara Peyton
(74) *Attorney, Agent, or Firm*—Samual George Campbell, II; John J. King; Thomas George (57) ABSTRACT

A method and system for a programmable input/output transceiver is disclosed. A circuit in accordance with the invention includes a programmable transceiver. The programmable transceiver is configured and/or controlled to support an interface standard. A system according to the present invention includes a programmable transceiver and a field-programmable gate array (FPGA) core coupled to program the programmable transceiver.

15 Claims, 8 Drawing Sheets

METHOD AND SYSTEM FOR PROGRAMMABLE INPUT/OUTPUT TRANSCEIVER WHEREIN TRANSCEIVER IN CONFIGURABLE TO SUPPORT A PLURALITY OF INTERFACE STANDARDS

FIELD OF THE INVENTION

This invention relates to the field of communications interfaces, and more particularly relates to a method and system for a programmable input/output (I/O) transceiver.

BACKGROUND

Today's digital systems interface with one another using a wide variety of interfaces. Each such interface is typically an implementation of an interface standard, which is defined by standards-making bodies such as the Institute of Electrical and Electronics Engineers (IEEE) or American National Standards Institute (ANSI), and promulgated thereby. Standardization ensures that implementations of such interfaces interoperate correctly and provide acceptable performance, under expected conditions. This allows an end-user to interface one such digital system (e.g., a computer, a digital camcorder or camera, a cellular telephone, a scanner, a television set) with another digital system, with confidence that the digital systems will be able to successfully communicate with one another.

In designing such systems, manufacturers are thus faced with supporting this variety of interface standards, or a substantial subset thereof. The complexity this engenders becomes readily apparent, for example, when one examines any of the currently-available desktop computers. Such a computer will typically support interfaces that include the Universal Serial Bus (USB), IEEE 1394 (also referred to as "Firewire"), Ethernet (including one or more of 10/100/1000 Base-T), memory stick and the like. As will be appreciated, each such standard interface has not only its own protocol definition(s), but also its own requirements as to output impedance, termination impedance, data rate, signal voltages and other such characteristics, as can be seen in Table 1.

TABLE 1

Characteristics of various interface standards.

| Interface Standard | Data Rate | Output Impedance | Termination Impedance | Other Features |
|---|---|---|---|---|
| USB 2.0 | 480 Mb/s | 45 ohms | 45 ohm Pull-Down (90 ohm Diff.) | 1 pair 800 mV (p-p) 18 mA 5 V tolerant |
| IEEE 1394a | 400 Mb/s | 100 ohms Diff. | 100 ohms Diff. | 2 pair 2.8 V (max) +/−4 mA |
| 100 B-T Ethernet | 100 Mb/s | 100 ohms | 100 ohms | 2 pair +/−1.8 V PAM5 modulation |

In designing such systems, manufacturers tend to prefer using programmable logic devices (PLDs) such as field-programmable gate arrays (FPGAs), as opposed to application-specific integrated circuits (ASICs), for a variety of reasons. A PLD is a type of integrated circuit (IC) that includes configurable resources such as configurable logic blocks, configurable input/output blocks, a configurable interconnect structure, memories, multipliers, processors, etc. The configurable resources of a PLD may be configured to implement a wide variety of desired functions. Typically, configuration data stored in configuration memory cells may be define the desired function in a PLD. The advantages provided by PLDs includes their greater flexibility, ability to be reconfigured (providing the ability to update their capabilities (even in the field) and reducing inventory by allowing a single part to be used in multiple applications), cost to develop, and other advantages.

What is therefore desired is an interface circuit that can be configured to support a variety of interface standards. Preferably, such a circuit may be easily implemented in a programmable logic device, and may allowing for support of as many such interface standards as possible. It is also preferable that such a circuit allow for the individual use of some or all of its components, such that those components are available for use in designs implemented in the programmable logic device that do not require such an interface circuit.

SUMMARY

In one embodiment, a system is disclosed. The system includes a programmable transceiver and field-programmable gate array (FPGA) fabric coupled to the programmable transceiver. In some embodiments, the FPGA fabric may be used to program the programmable transceiver.

In another embodiment, a circuit is disclosed. The circuit includes a programmable transceiver. The programmable transceiver is configured and/or controlled to support an interface standard. The interface standards thus supported can be, for example, a Universal Serial Bus interface standard, an IEEE 1394 interface standard or an Ethernet interface standard.

In yet another embodiment, a method is disclosed. The method includes programming an FPGA core of an integrated circuit (IC) and causing the FPGA core to program a programmable transceiver of the IC. The programmable transceiver is coupled to the FPGA core. The IC comprises the FPGA core and the programmable transceiver.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and numerous objects, features, and advantages made apparent to those skilled in the art by referencing the accompanying drawings.

The use of the same reference symbols in different drawings indicates similar or identical items.

DETAILED DESCRIPTION

The following is intended to provide a detailed description of an example of the invention and should not be taken to be limiting of the invention itself. Rather, any number of variations may fall within the scope of the invention which is defined in the claims following the description.

Introduction

The invention provides a method and system for a programmable transceiver. Such a programmable transceiver is capable of supporting a number of interface standards, including USB, IEEE 1394a and Ethernet (and other pulse-amplitude modulated (PAM) signals), as well as wireless transmission standards (e.g., IEEE 802.11a/b/g, Blue-Tooth™, and other wireless communications standards), small computer systems interface (SCSI) standards, integrated drive electronics (IDE) interface standard, serial advanced technology attachment (serial ATA or SATA) interface standard and other such interface standards, as a result of having the ability to provide signal and interface parameters appropriate to the given standard. This is accomplished by allowing a designer to control output and termination impedances, clocking and clock recovery, operating frequency (and thus, the data rate), serialization/de-serialization and other aspects of the programmable transceiver's receiver and transmitter. Such an interface circuit can be implemented, for example, in an integrated circuit such as a programmable logic device (PLD). One example of a PLD is an FPGA.

The basic concept is to provide a programmable transceiver that employs a flexible analog front end using an analog-to-digital converter (ADC) in the interface's receiver and a digital-to-analog converter (DAC) in the interface's transmitter. An FPGA core (also referred to as FPGA fabric) adapts (and adapts to) the interface. ADCs and DACs are well suited for such applications. Because an interface is to be implemented, other elements, such as controlled output impedance, programmable terminations, serialization/de-serialization, clocking and the like, may also be needed. For example, impedances can be configured using programmable impedance networks, while serialization/de-serialization can be performed using a parallel-to-serial converter (e.g., a multiplexer) and a serial-to-parallel converter (e.g., a demultiplexer), respectively. Such serialization/de-serialization is often necessary as a result of the difference between the FPGA core's operating frequency, and that of the incoming/outgoing datastream.

That being the case, clock generation and recovery are handled by a clock multiplier unit (CMU) in the transmitter and a clock/data recovery unit (CDRU) in the receiver, respectively. Both the CMU and CDRU are programmable, allowing the characteristics of the programmable transceiver to be altered, and thus support the desired interface standard. This is necessitated by the high sampling rate required to properly digitize the incoming datastream, and the high data rate of the outgoing datastream.

In particular, a CDRU according to the present invention provides a great deal of flexibility because many of the components of such a CDRU may be controlled (e.g., by control signals or configuration memory cells) by the FPGA core. This allows for flexibility in the algorithm used for clock/data recovery and synchronization in a programmable receiver of the present invention. Such an approach also allows for the use of digital signal processing DSP techniques within the FPGA core, allowing a programmable receiver and/or transmitter to enjoy the benefits provided by such DSP techniques.

A current sourcing DAC can be employed in a programmable transmitter of the present invention. This is an attractive alternative because certain interface standards (e.g., USB) employ current-sourcing drivers. Other interface standards, which use different driver arrangements, can be emulated. For example, it will be appreciated that the voltage on a signal line is proportional to the current and the load resistance, which can be used to set the programmable transmitter's output level. As will be appreciated, the ADC of a programmable receiver of the present invention is also flexible in this regard, and is thus able to correctly interface with such configurations of its corresponding transmitter.

When implementing a programmable transceiver of the present invention, there are also opportunities to add flexibility that is outside of the traditional transceiver role, by allowing for one or more of the programmable transceiver's components to be used separately. For example, the programmable transceiver's CMU or CDRU can be configured in such a manner that one or both can be used separately from the programmable transceiver, making a separate clock multiplier unit, or a digitally-controlled frequency synthesizing phase-locked loop (PLL). Another alternative is making the ADC and/or DAC available separately, for use as a generic ADC and/or DAC. Additionally, such elements can be aggregated, e.g., by pipelining, to provide higher resolution and/or speed.

As will also be appreciated, a programmable transceiver according to the present invention can also be designed to allow for the individual use of some or all of its components, such that those components are available for use in designs implemented in the programmable logic device that do not require such an interface circuit. For example, the ADC, DAC, CMU, CDRU and other components of such a programmable transceiver can be coupled to allow their use in other configurations of the programmable logic device, separate and apart from their use in the programmable transceiver. This provides even more flexibility in a programmable logic device incorporating a programmable transceiver of the present invention.

The availability of a flexible, high-speed interface capable of supporting a variety of interface standards is therefore a valuable and advantageous feature, particularly in PLDs such as FPGAs. Other advantages include the integration of key interface features, a reduction in cost/parts count/size of designs using such a device, and flexibility (single design, multiple solutions, upgradeable), among other such advantages.

Example Programmable Transceiver and Operation Thereof

Figure 1:
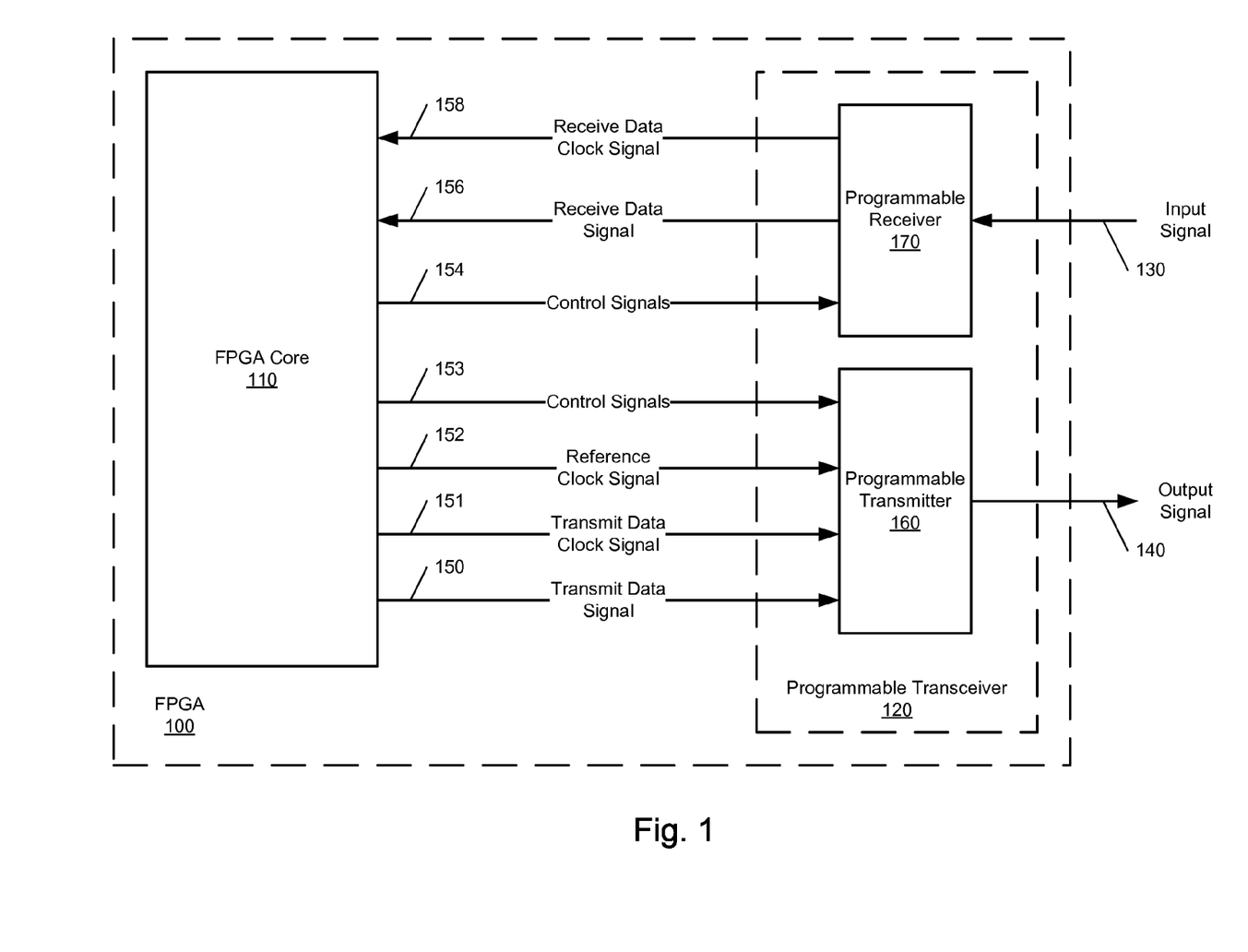
FIG. 1 is a block diagram illustrating a programmable transceiver of the present invention.

FIG. 1 is a block diagram illustrating a programmable logic device, depicted in FIG. 1 as a Field-Programmable Gate Array (FPGA) 100, according to the present invention. As will be appreciated, FPGA 100 is merely an example of the kind of integrated circuit that might employ embodiments of the present invention. Among other possible elements, FPGA 100 includes an FPGA core 110 that communicates with devices outside of FPGA 100 via a programmable transceiver 120 according to the present invention. FPGA core 110 may include various configurable resources and configurable memory cells.

Programmable transceiver 120 receives an input signal 130, which is processed by programmable transceiver 120 and passed to FPGA core 110. Conversely, programmable transceiver 120 generates an output signal 140 from signals received from FPGA core 110. These signals may include a transmit data signal 150 and a transmit data clock 151, as well as a reference clock 152 and control signals 153, on the transmit side. On the receive side, these signals may include control signals 154. Also on the receive side, programmable transceiver 120 provides several signals to FPGA core 110, including a receive data signal 156 and a receive data clock signal 158.

More specifically, these signals are provided to and from the basic building blocks of programmable transceiver 120, which include a programmable transmitter 160 and a programmable receiver 170, as depicted in FIG. 1. It should be noted that these signals are merely examples of the kinds of signals that can be passed between programmable transceiver 120 and FPGA core 110.

As will be appreciated, FPGA core 110 provides the data to be transmitted, as well as its associated clock signal, to programmable transmitter 160 via transmit data signal 150 and transmit data clock signal 151, respectively. Reference clock signal 152 is sent to the clock multiplier unit of programmable transmitter 160, which multiplies the frequency of reference clock signal 152 under the control of control signals 153, resulting in a high-speed clock that is used to transmit the data from programmable transmitter 160.

In a similar fashion, programmable receiver 170 provides receive data signal 156 and receive data clock signal 158 to FPGA core 110, and thus presents a digitized, synchronized representation of the received datastream (e.g., input signal 130) to FPGA core 110. As in the case of programmable transmitter 160, the configuration and operation of programmable receiver 170 is controlled by FPGA core 110. FPGA core 110 controls programmable receiver 170 via control signals 154.

It will be appreciated that control signals 153 and 154 allow FPGA core 110 not only to configure and control programmable transmitter 160 and programmable receiver 170 statically, but also dynamically. This allows for support not only of various interface standards, but also of adaptive configuration and operation. In this manner, FPGA core 110 can be configured to change the operating parameters of programmable transmitter 160 and programmable receiver 170 dynamically to account for variations in signal propagation, data rate, encoding and other such parameters. In other embodiments, part or all of programmable transmitter 160 and programmable receiver 170 may be controlled and configured by one or more configuration memory cells (not shown).

Regarding the signals described herein, those skilled in the art will recognize that a signal may be directly transmitted from a first block to a second block, or a signal may be modified (e.g., amplified, attenuated, delayed, latched, buffered, inverted, filtered or otherwise modified) between the blocks. Although the signals of the above-described embodiment are characterized as transmitted from one block to the next, other embodiments of the present invention may include modified signals in place of such directly transmitted signals as long as the informational and/or functional aspect of the signal is transmitted between blocks. To some extent, a signal input at a second block may be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

The foregoing described embodiment wherein the different components are contained within different other components (e.g., the various elements shown as components of FPGA 100). It is to be understood that such depicted architectures are merely examples, and that in fact many other architectures can be implemented that achieve the same functionality. Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "[operably] connected", or "[operably] coupled", to each other to achieve the desired functionality.

Figure 2:
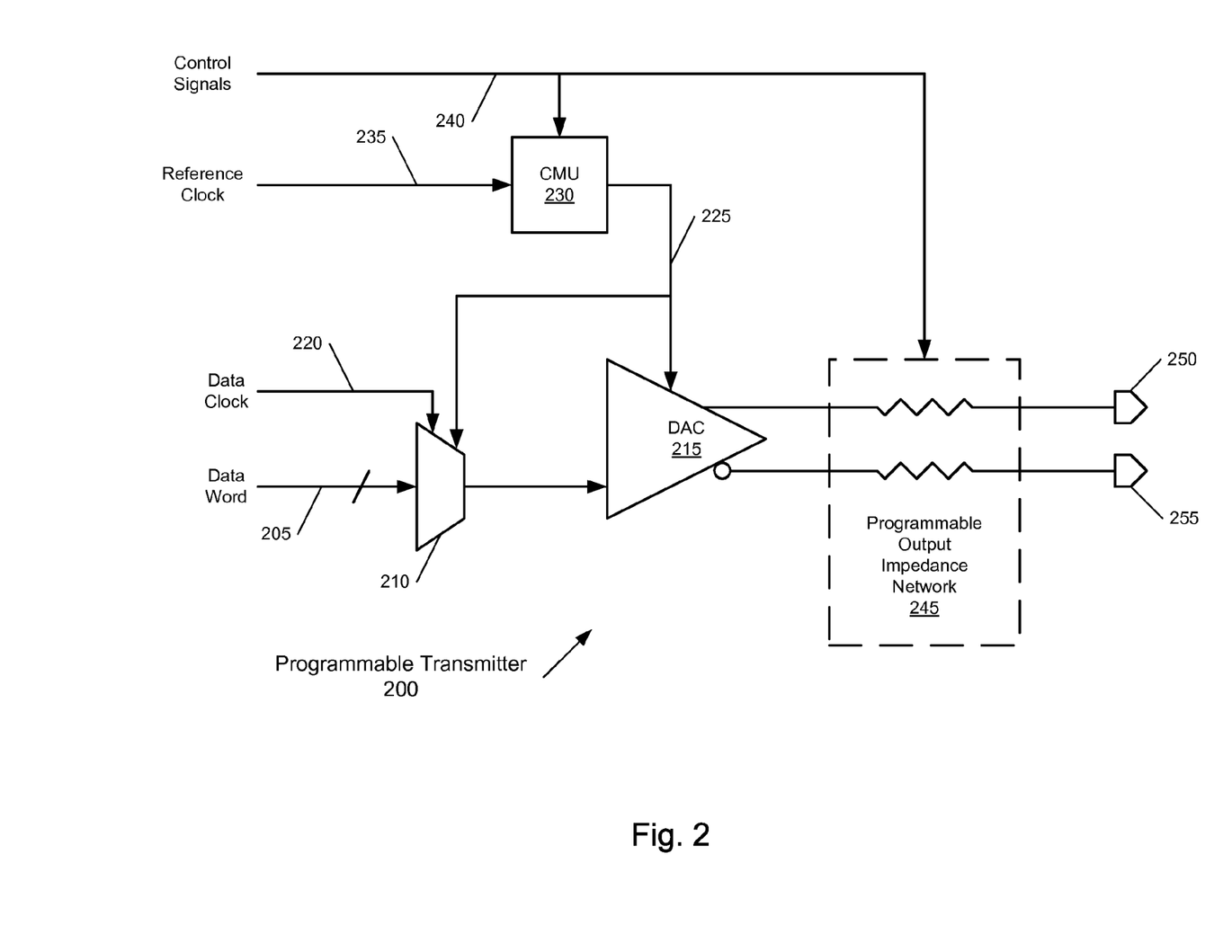
FIG. 2 is a block diagram illustrating a programmable transmitter of the present invention.

FIG. 2 is block diagram of a programmable transmitter 200, which is an example of programmable transmitter 160 of FIG. 1. Programmable transmitter 200 receives a data word 205, which will typically be a number of data lines carrying data from FPGA core 110. Example data bus widths include 2 bytes, 4 bytes and 8 bytes, although it will be apparent that any convenient width can be used for data word 205.

The data provided by data word 205 is multiplexed by a multiplexer 210 into a datastream provided to a digital-to-analog converter (DAC) 215. As noted, this serialization is typically necessitated by the high-speed nature of the outgoing datastream, relative to the operating frequency of FPGA core 110, although it will be appreciated that this serialization will typically take the form of converting a multi-word datastream into a single-word datastream. Typically, then, multiplexer 210 will have a lower data rate (i.e., lower frequency) input section matched to the operating frequency of FPGA core 110, and a higher data rate (i.e., higher frequency) output section matched to that of the outgoing datastream.

Multiplexer 210 receives a data clock 220 from FPGA core 110, which drives the input side of multiplexer 210. Multiplexer 210 also receives a high-speed clock 225, which drives the output side of multiplexer 210. High-speed clock 225 is generated by a clock multiplier unit (CMU) 230 from a reference clock 235 received from FPGA core 110. FPGA core 110 controls the generation of high-speed clock 225 by CMU 230 via a control signals 240.

As will be appreciated, such a multiplexer can be implemented such that an entire multi-byte data word (e.g., data word 205) is clocked in at the clock rate of data clock 220, and a single-byte data word output to DAC 215 at the clock rate of high-speed clock 225. Data flow on both sides of multiplexer 210 is thus maintained. However, given that small variations may occur in the ratio of the clock rate of data clock 220 and the clock rate of high-speed clock 225, multiplexer 210 can also include a first-in, first-out (FIFO) memory. This allows for situations in which outgoing data "builds up" on the low-speed side of multiplexer 210 as a result of data clock 220 (and thus, the data rate of data word 205) becoming proportionally faster than high-speed clock 225 (i.e., in the aggregate, data is coming into multiplexer 210 faster than data is going out from multiplexer 210). This also allows for situations in which data clock 220 is becoming proportionally slower than high-speed clock 225.

DAC 215 also receives high-speed clock 225, which causes DAC 215 to perform its digital-to-analog conversion at the appropriate rate, and provides a differential output to a programmable output impedance network 245, which matches the output impedance of DAC 215 to the load presented at output pins 250 and 255. It will be appreciated that programmable output impedance network 245 can be programmed along with FPGA core 110, or can be controlled by FPGA core 110 (statically or dynamically, using control signals 240, in the manner noted). As will be appreciated, although the examples discussed herein are discussed in terms of differential signal transmission, a programmable transceiver of the present invention is also capable of supporting single-ended protocols (e.g., single-ended SCSI (small computer systems interface) communications, single-ended serial communications (e.g., RS-232C) and the like).

In operation, data word 205 is received from FPGA core 110, and serialized by multiplexer 210. The input data rate of multiplexer 210 is controlled by data clock 220, while the output data rate of multiplexer 210 is controlled by high-speed clock 225, as noted. This datastream is received by DAC 215, which converts the digital data therein into an analog signal having the proper signal characteristics.

It will be appreciated that, while DAC 215 can be implemented using a standard DAC architecture, the interface definitions capable of being implemented by the programmable transceiver may dictate the architecture of DAC 215 (e.g., a DAC design having higher precision, but a lower data rate, may be desirable). As will be appreciated, implementing DAC 215 using a programmable DAC is an attractive alternative, such as an implementation allows DAC 215 to alter its characteristics to suit the situation. If a programmable DAC is employed, DAC 215 can be designed to be controlled externally, by FPGA core 110, or by a combination of these methods.

Once generated, the output of DAC 215 is then matched to the signal line coupled to output pins 250 and 255 by programmable output impedance network 245. Thus, by appropriately configuring CMU 230, multiplexer 210, DAC 215, and programmable output impedance network 245, a signal and interface having the characteristics appropriate for a given interface standard can be configured. Such characteristics will typically include data rate, output voltage and/or current ranges, output impedance, and the like.

Figure 3:
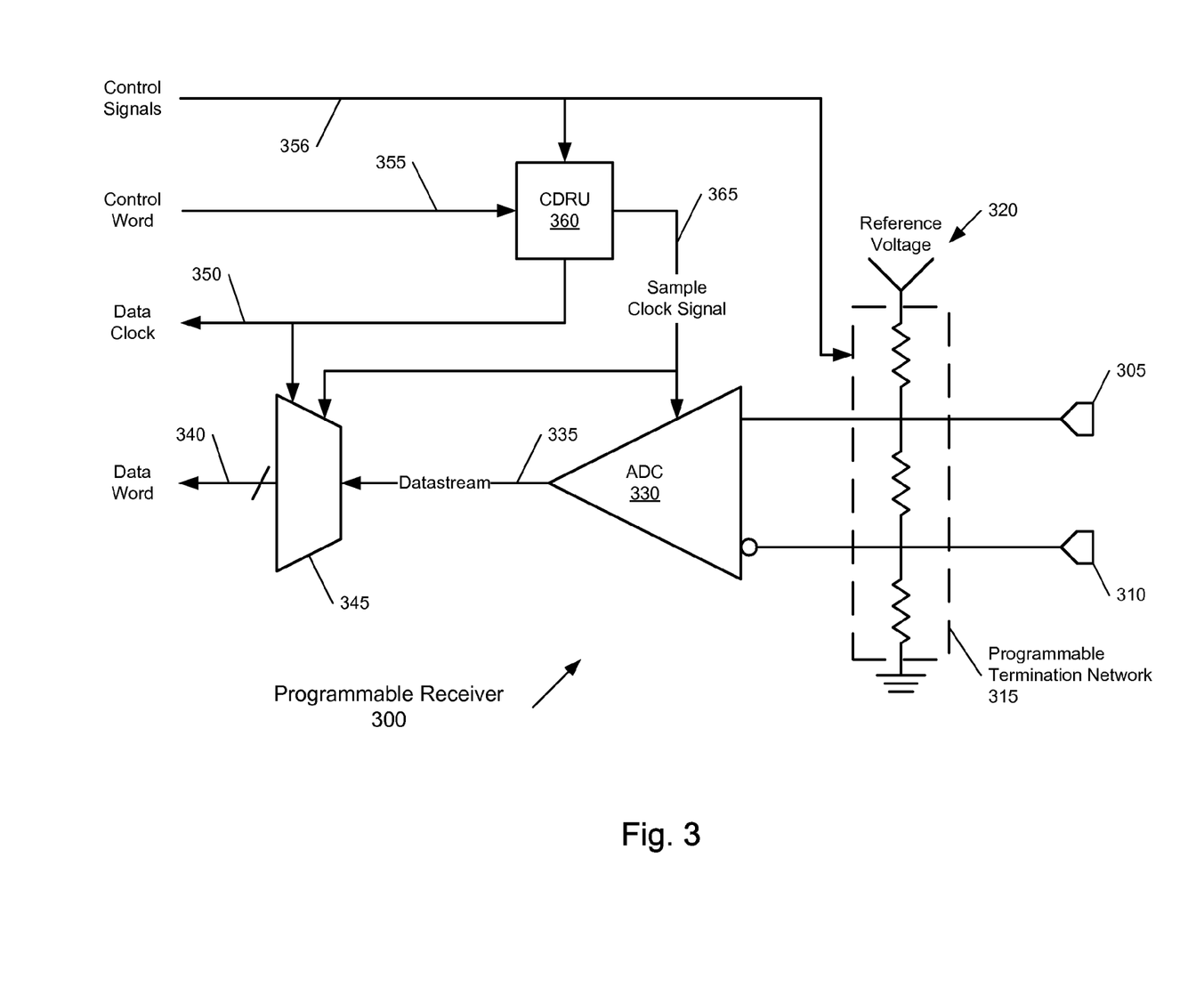
FIG. 3 is a block diagram illustrating a programmable receiver of the present invention.

FIG. 3 is a block diagram illustrating a programmable receiver 300, which is an example of programmable receiver 170 of FIG. 1. Programmable receiver 300 receives a differential signal pair, or alternatively, a single-ended signal, at input pins 305 and 310. This differential signal pair is provided to a programmable termination network 315, which maintains the signal levels presented on input pins 305 and 310 between a reference voltage 320 and a ground 325, and thus appropriately terminates the signal line and couples that signal line to an analog-to-digital converter (ADC) 330.

ADC 330 converts the incoming differential (or single-ended) signal into a datastream 335, which is subsequently converted into a data word 340 by a demultiplexer 345, which de-serializes datastream 335. Demultiplexer 345 receives a data clock 350, which is also provided to FPGA core 110, along with data word 340, allowing FPGA core 110 to properly recognize data word 340. Based at least in part on data clock 350 and data word 340, FPGA core 110 provides a control word 355 and control signals 356 to clock/data recovery unit (CDRU) 360. It will be appreciated that certain of control signals 356 can also be used to control programmable termination network 315, in the manner previously discussed.

In turn, CDRU 360 generates data clock 350 and a sample clock signal 365. Data clock 350 is provided to demultiplexer 345, in order to clock data out of demultiplexer 345 at a rate appropriate for input to FPGA core 110, as well as to FPGA core 110, as noted. Sample clock signal 365 is provided to demultiplexer 345, in order to allow the bits of to be clocked into demultiplexer 345 at an appropriate rate, and to ADC 330, in order to control the point at which ADC 330 samples the incoming signal.

In a manner complementary to that of multiplexer 210, demultiplexer 345 receives a high-data-rate datastream (e.g., datastream 335) and converts it to a lower-data-rate datastream (e.g., data word 340). In one embodiment, demultiplexer 345 receives datastream 335 (e.g., a single byte in width) at a rate governed by sample clock signal 365, and outputs data words (e.g., multiple bytes in width) at a rate governed by data clock 350. As before, proportional differences in data rate (i.e., operating frequency) experienced in data clock 350 and sample clock signal 365 can be accounted for by implementing a FIFO memory within demultiplexer 345.

Generally, then, feedback loops are formed variously by ADC 330, demultiplexer 345, FPGA core 110 and CDRU 360. The components and operation of CDRU 360, as well as that of the feedback loop, is described in further detail with regard to FIG. 4.

Figure 4:
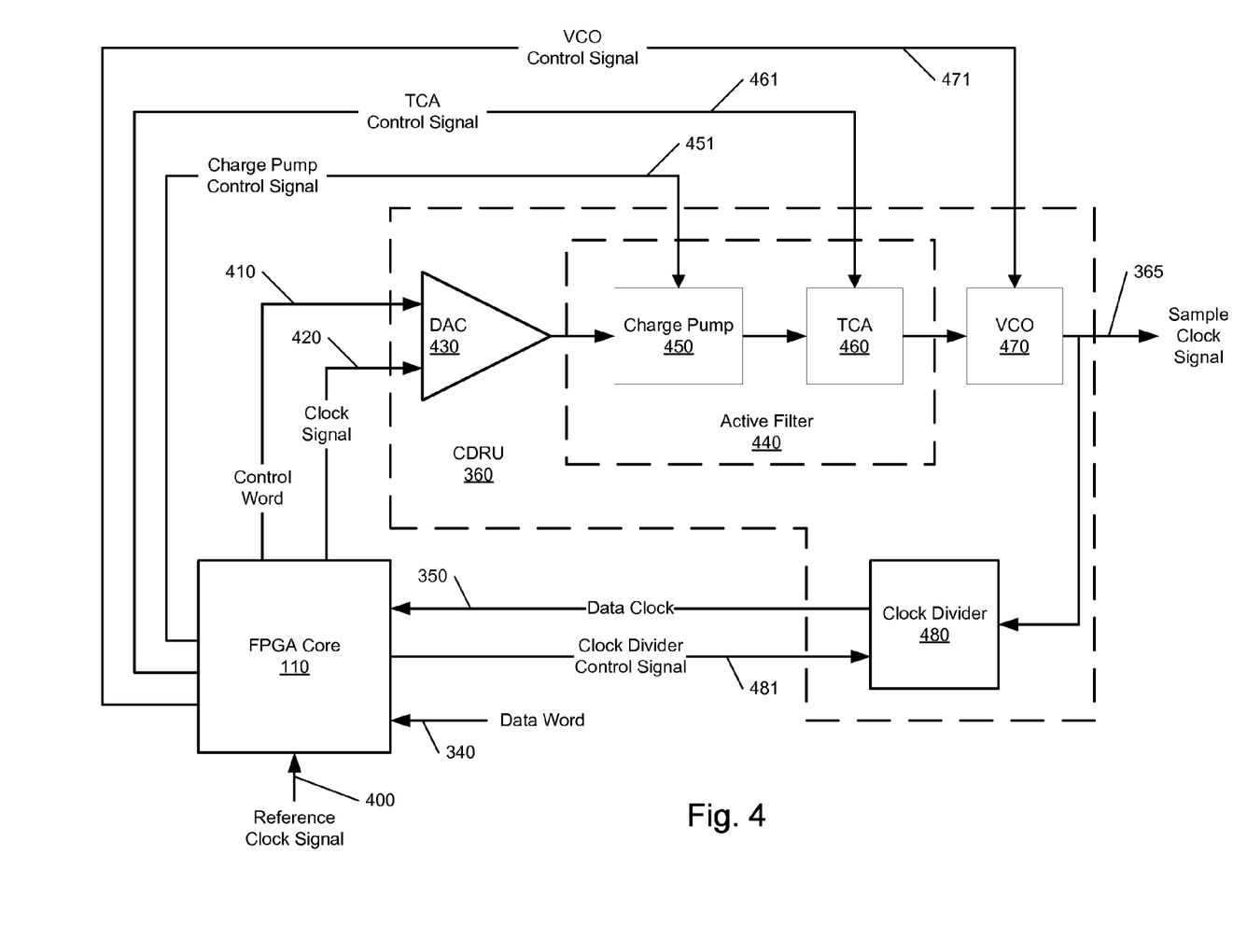
FIG. 4 is a block diagram illustrating a clock/data recovery unit of the present invention.

FIG. 4 is a block diagram illustrating CDRU 360, as well as its connections to FPGA core 110, in greater detail. As can be seen in FIG. 4, FPGA core 110 receives data word 340 and data clock 350, in the manner suggested in FIG. 3. FPGA core 110 also receives a reference clock signal 400. As will be appreciated, reference clock signal 400 is a reference for the clock of the datastream received by FPGA 100. Depending on the design of FPGA 100, reference clock signal 400 can be synchronous to the incoming datastream, or asynchronous thereto. If reference clock signal 400 is asynchronous to the incoming datastream, reference clock signal 400 is typically asynchronous to within a certain range (e.g., 100 ppm). In that case, a CDRU can be employed to lock reference clock signal 400 to the phase and frequency of the incoming datastream, for example.

In turn, FPGA core 110 provides a control word 410 and a clock signal 420 to CDRU 360. Within CDRU 360, a DAC 430 receives control word 410 and clock signal 420, and converts this digital information into a representative analog signal (a voltage), which is then provided to an active filter 440. Preferably, DAC 430 is a high-precision DAC. The necessary precision is defined by the need to maintain jitter in sample clock signal 365 at a level below that which would prevent the reliable reception of data by programmable receiver 300, when configured to support the desired interface specification. With regard to precision, this criteria translates into keeping quantization noise to an acceptable level (i.e., avoiding "dead-band", a situation in which the desired output level is between two quantization levels).

Active filter 440 includes a charge pump 450, which receives the output voltage of DAC 430, and is controlled by a charge pump control signal 451 generated by FPGA core 110. Charge pump 450 generates a current that is provided to a transconductance amplifier (TCA) 460, which is controlled by a TCA control signal 461 generated by FPGA core 110. TCA 460 outputs a voltage corresponding to the input current, to a voltage-controlled-oscillator (VCO) 470 at an output of active filter 440.

Using this voltage, VCO 470 converts the voltage provided by active filter 440 into sample clock signal 365, again under the control of a VCO control signal 471 from FPGA core 110.

Sample clock signal 365 has a frequency representative of the voltage generated by active filter 440. Sample clock signal 365 is provided at an output of CDRU 360, for use as illustrated in FIG. 3. Sample clock signal 365 is also provided to a clock divider 480, which is controlled by FPGA core 110 via a clock divider control signal 481.

In this manner, data word 340 and data clock 350 are provided to FPGA core 110, and cause FPGA core 110 to produce control word 410 and clock signal 420, as well as charge pump control signal 451, TCA control signal 461, VCO control signal 471 and clock divider control signal 481, which drive CDRU 360, and so generate sample clock signal 365, which is in turn used by ADC 330 in generating data word 340 and data clock 350.

Figure 5:
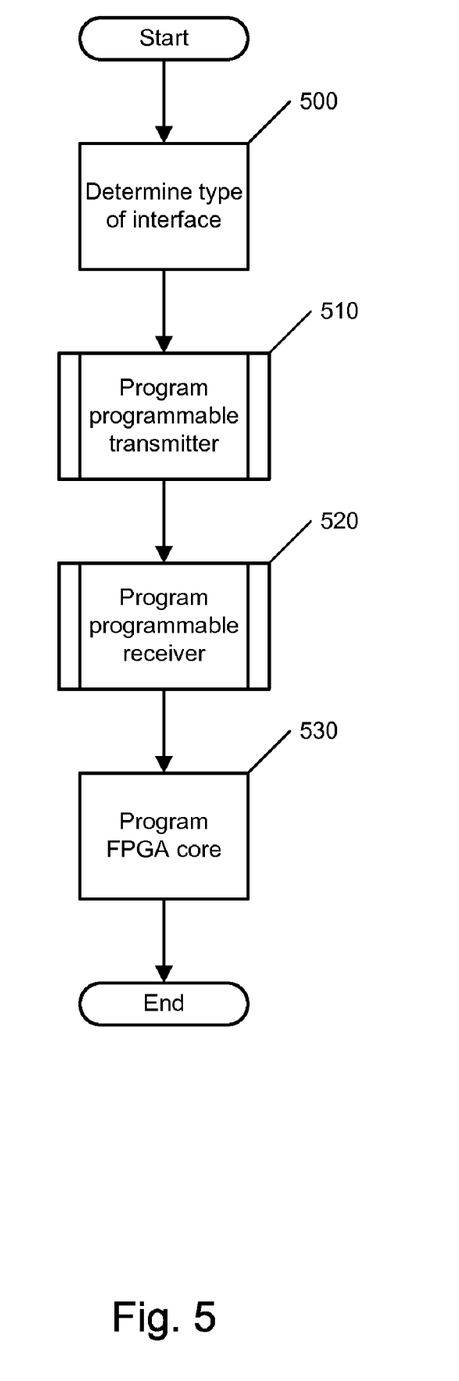
FIG. 5 is a flow diagram of a process for programming a programmable transceiver, according to a method of the present invention.

FIG. 5 is a flow diagram of a process for programming a programmable transceiver such as programmable transceiver 120, according to a method of the present invention. The process includes a determination of the type of interface the programmable transceiver is to provide (step 500). In this operation, the type of interface to be supported (e.g., IEEE 1394, USB, 10/100/1000 Base-T Ethernet) is selected. Based on this determination, the affected components of the programmable transceiver's programmable transmitter are programmed appropriately (step 510). The programming of the programmable transmitter is discussed in further detail in connection with FIG. 6. The affected components of programmable transceiver's programmable receiver are also programmed based on the foregoing determination (step 520). The programming of the programmable receiver is discussed in further detail in connection with FIGS. 7 and 8.

It will be appreciated that certain of these components may be programmed only at the outset, retaining their configuration until being reprogrammed (and therefore may be considered to be static until such reprogramming occurs). For example, the impedance networks may retain their configuration in this manner when not programmed dynamically. Typically, such programming is performed at the time the FPGA core is programmed, though this need not be the case. Other such components, as noted, may be controlled by the FPGA core, and so can be reconfigured dynamically (e.g., on the order of the data rate).

Once the programmable transmitter and receiver have been programmed, FPGA core 110 is programmed. This is performed such that FPGA core 110 is adapted to accept the programmable transceiver's output and/or to provide the appropriate data, clock and control signals to the programmable transceiver (step 530).

As noted, FIG. 5 depicts a flow diagram illustrating a process according to an embodiment of the present invention, as do the other flow diagrams presented herein. It is appreciated that operations discussed herein may consist of directly entered commands by a computer system user or by steps executed by application specific hardware modules or a combination thereof, and may be performed in any convenient and appropriate order. The functionality of steps referred to herein may correspond to the functionality of modules or portions of modules.

The operations referred to herein may be modules or portions of modules (e.g., software, firmware or hardware modules). For example, while the described embodiment includes field-programmable gate arrays, application specific integrated circuits and other such hardware modules, the various example modules may be implemented as software modules and/or include manually entered user commands. The software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into submodules to be executed as multiple computer processes, and, optionally, on multiple computers. Moreover, alternative embodiments may combine multiple instances of a particular module or submodule. Furthermore, those skilled in the art will recognize that the operations described in example embodiment are for illustration only. Operations may be combined or the functionality of the operations may be distributed in additional operations in accordance with the invention.

Alternatively, such actions may be embodied in the structure of circuitry that implements such functionality, such as the micro-code of a complex instruction set computer (CISC), firmware programmed into programmable or erasable/programmable devices, the configuration of a PLD (e.g., an FPGA), the design of a gate array or full-custom application-specific integrated circuit (ASIC), or the like.

Figure 6:
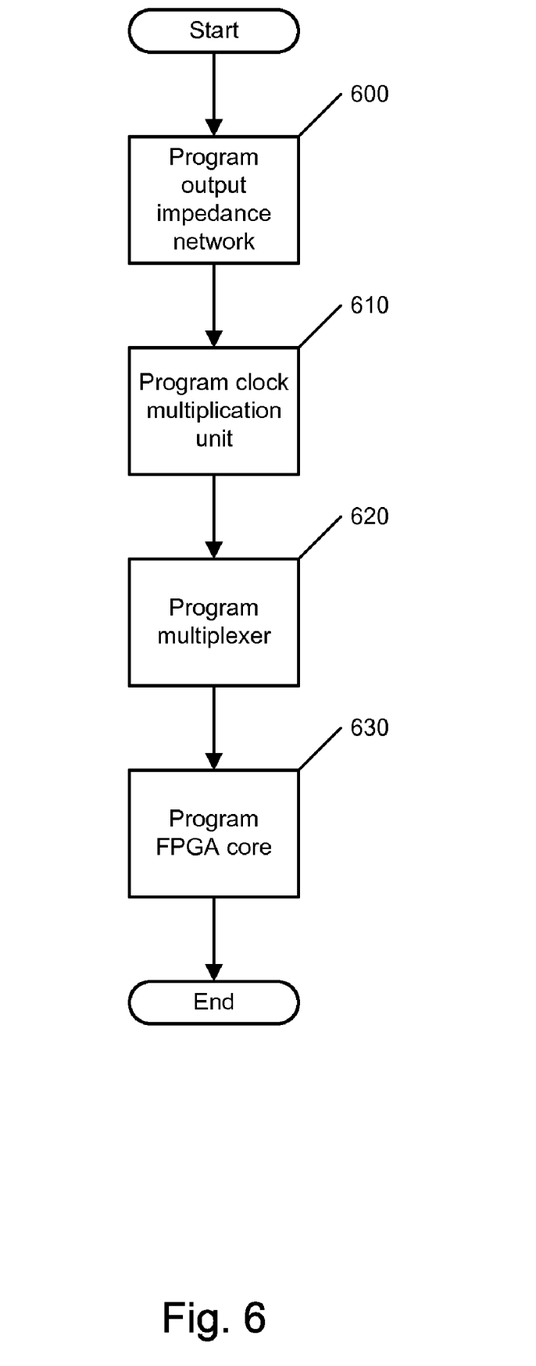
FIG. 6 is a flow diagram of a process for programming a programmable transmitter, according to a method of the present invention.

FIG. 6 is a flow diagram of a process for programming a programmable transmitter such as programmable transmitter 200, according to a method of the present invention, as defined by the type of interface the programmable transmitter is to support. The process includes programming of the transmitter's programmable output impedance network (step 600). This operation matches the transmitter's output to the device with which the programmable transceiver is communicating, and, as noted, can be performed statically or dynamically.

The transmitter's clock multiplier unit (CMU) is programmed (step 610). As noted, the CMU multiplies the reference clock received from the FPGA's core, allowing the programmable transmitter's DAC to operate at the proper frequency for the given data rate, and typically, at a higher frequency than the FPGA's core. As a result of the communications standards supported, the programmable transmitter's output will often be at a significantly higher frequency than the operating frequency of the FPGA's core. To that end, the data word output by the FPGA's core is converted from a relatively lower frequency, relatively wide parallel datastream (e.g., 2, 4 or 8 bytes in width) into a higher frequency, relatively narrower datastream (e.g., a single byte in width). This serialization is effected by the transmitter's multiplexer, which is programmed to receive data of the requisite width from the FPGA's core, and to convert that data into the requisite datastream (step 620). The FPGA's core is programmed to provide the proper clock and data signals to the transmitter (step 630).

Figure 7:
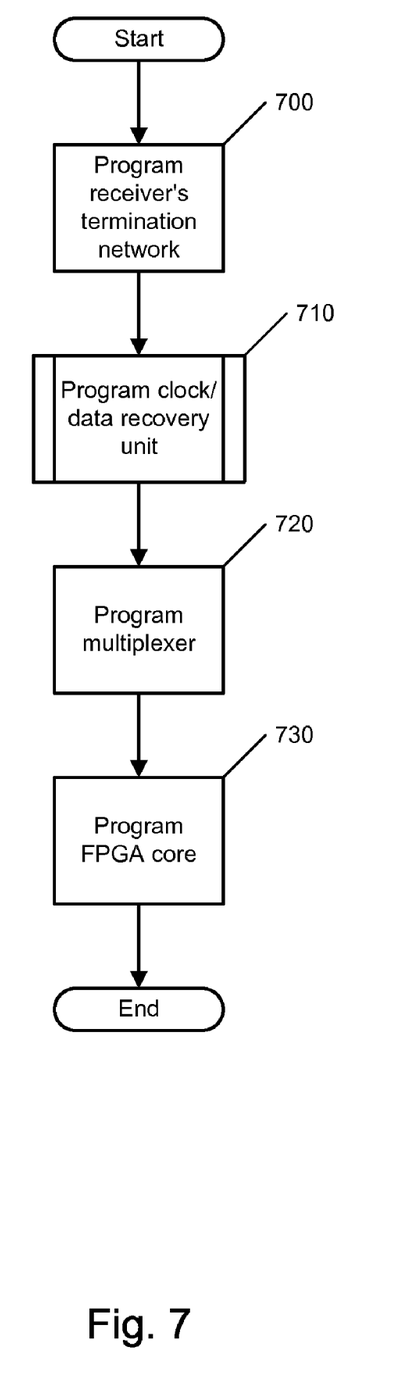
FIG. 7 is a flow diagram of a process for programming a programmable receiver, according to a method of the present invention.

FIG. 7 is a flow diagram of a process for programming a programmable receiver such as programmable receiver 300, according to a method of the present invention. Such programming is defined by the type of interface the programmable receiver is to support. The process includes programming of the receiver's programmable termination network (step 500). This operation matches the receiver's input from the device from which the programmable transceiver is receiving signals, and can be accomplished statically or dynamically, as noted.

The receiver's clock/data recovery unit (CDRU) is programmed (step 710). The programming and operation of such a CDRU is described in further detail in connection with FIG. 8. In a manner similar to that noted above, the programmable receiver's ADC typically operates (or at least, can operate) at a significantly higher frequency than the FPGA's core. As will be appreciated, then, the programmable receiver's input will often be at a significantly higher frequency than the operating frequency of the FPGA's core, again as a result of the communications standards supported. To that end, the data word to be output to the FPGA's core is converted from a relatively high-frequency datastream into a relatively lower-frequency parallel datastream of the appropriate width (e.g., 2, 4 or 8 bytes in width). This de-serialization is effected by the receiver's demultiplexer, which is programmed to receive a datastream from the receiver's ADC, and to convert the data thus received into data of the requisite width, for provision to the FPGA's core (step 720). The FPGA's core is programmed to provide the proper clock and data signals to the receiver, and to receive the data and clock signals generated by the programmable receiver (step 730).

Figure 8:
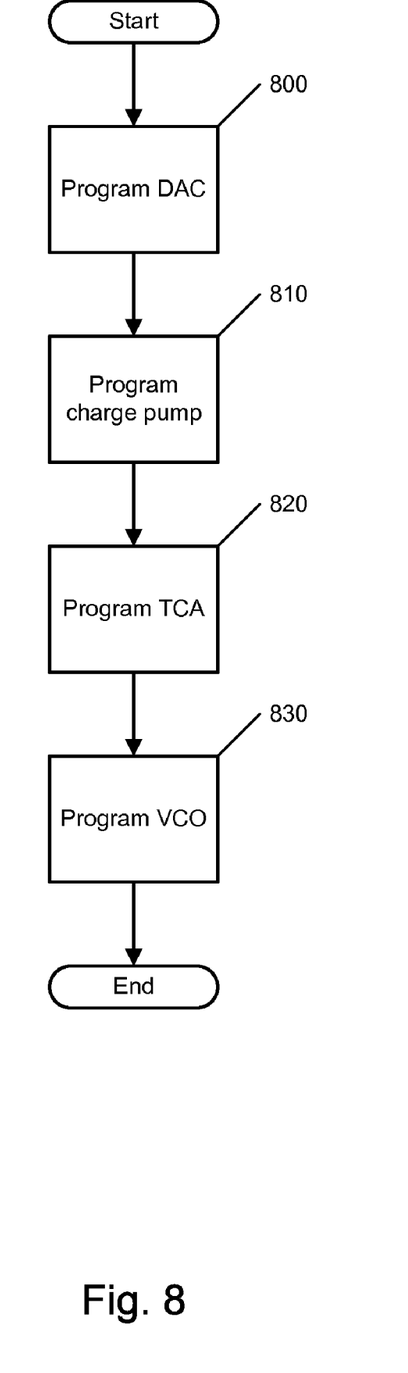
FIG. 8 is a flow diagram of a process for programming a programmable clock/data recovery unit, according to a method of the present invention.

FIG. 8 is a flow diagram of a process for programming a programmable clock/data recovery unit (CDRU) such as CDRU 360, according to a method of the present invention. The process includes programming of the digital-to-analog converter (DAC) by the FPGA's core (step 800). In providing the FPGA's core with the ability to program the DAC, several advantages are provided. First, the FPGA's core is able to adjust the point at which the ADC samples the incoming signal, and so optimizes the sampling point to provide the most accurate sampling (and so, conversion) of the incoming datastream. Moreover, providing the FPGA's core with the ability to alter the point at which the incoming datastream is sampled, allows for configurability of the programmable receiver (e.g., for support of different input frequencies, such as 10/100/1000 Base-T). Such configurability also allows configuration to occur "on-the-fly," providing for dynamic configuration, as well as adjustment.

Also programmed are the charge pump (step 810) and transconductance amplifier (TCA) (step 820), which make up an active filter that filters the output of the DAC, and provides the filtered output to the voltage-controlled oscillator (VCO). The VCO is also programmed, for example, by setting its voltage range setting (e.g., using one or more VCO control signals), to properly accommodate the output of the active filter (step 830). It will be appreciated that programming the active filter (i.e., charge pump and TCA) will result in the active filter having variable gain and bandwidth, allowing the active filter to be configured for the given interface application. The FPGA's core can perform such configuration "on-the-fly," and so can easily adapt the transceiver to support any one of a variety of interface standards.

Thus, the ADC, the multiplexer, the FPGA core and the CDRU form a feedback loop. Once configured, processing performed by the FPGA core allows the frequency output by the CDRU to be adjusted, altering the point in the incoming datastream at which the ADC samples. The FPGA core is thus configured, in part, to analyze the data provided by the programmable receiver, and so provide a control word to the CDRU (more specifically, to the CDRU's DAC). In fact, the FPGA core can be configured to perform digital signal processing on the data, to improve the accuracy of such adjustments, as well as other features. Control over sample clock signal 365 is then effected using the various control signals generated by the FPGA core (e.g., control word 410, clock signal 420, charge pump control signal 451, TCA control signal 461, VCO control signal 471 and clock divider control signal 481).

As will be appreciated, to avoid aliasing, the sampling frequency supplied by the CDRU should be at or above the frequency of the incoming datastream. As will also be appreciated, the present invention also allows for oversampling of the incoming datastream, if desired (e.g., in the case of a high-noise environment). Again, such parameters are within the control of the FPGA core, in a programmable transceiver of the present invention.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Moreover, while the invention has been particularly shown and described with reference to these specific embodiments, it will be understood by those skilled in the art that the foregoing and other changes in the form and details may be made therein without departing from the spirit or scope of the invention.

What is claimed is:

1. A circuit, comprising:
    a programmable transceiver including a programmable transmitter, wherein:
    said programmable transceiver is configured to be programmed to support a plurality of interface standards, and
    said programmable transmitter comprises:
        a parallel-to-serial converter programmed to transmit data at a predetermined rate for a selected interface standard of said plurality of interface standards,
        a digital-to-analog converter (DAC),
        a clock multiplier unit (CMU), coupled to said parallel-to-serial converter and said DAC, and
        a programmable output impedance network coupled to an output of said DAC, said programmable output impedance network being programmed to provide a predetermined output impedance for said selected interface standard.

2. The circuit of claim 1, wherein:
    said programmable transceiver further comprises a programmable receiver.

3. The circuit of claim 2, further comprising:
    a plurality of configurable logic blocks,
    wherein at least one of said plurality configurable logic blocks is configured to implement at least a portion of said circuit.

4. The circuit of claim 2, wherein:
    said programmable transceiver is controlled by an integrated circuit (IC) including programmable logic, and
    said IC comprises said programmable transceiver.

5. The circuit of claim 4, wherein:
    said CMU is a programmable CMU.

6. The circuit of claim 5, wherein:
    said CMU is coupled to provide a first clock signal to said parallel-to-serial converter and said DAC, and
    said parallel-to-serial converter is configured to receive a second clock signal from said programmable logic.

7. The circuit of claim 5, wherein said programmable receiver comprises:
    an analog-to-digital converter (ADC);
    a serial-to-parallel converter; and
    a clock/data recovery unit (CDRU) coupled to said ADC and said serial-to-parallel converter.

8. The circuit of claim 7, wherein:
    said CDRU is coupled to provide a first clock signal to said serial-to-parallel converter and said ADC, and
    said CDRU is coupled to provide a second clock signal to said serial-to-parallel converter.

9. The circuit of claim 7, further comprising a programmable termination network, wherein:
said programmable termination network is coupled to an input of said ADC, and
said CDRU is a programmable CDRU.

10. A method of configuring a programmable transceiver, comprising:
programming an integrated circuit (IC) including a programmable core; and
causing said programmable core to configure said programmable transceiver to support a plurality of interface standards, wherein:
said IC comprises said programmable transceiver, and
said causing comprises:
configuring a clock multiplication unit, and a digital-to-analog convertor (DAC) of a programmable transmitter of said programmable transceiver;
programming a parallel-to-serial converter to transmit data at a predetermined rate for a selected interface standard of a plurality of interface standards; and
programming a programmable output impedance network to provide a predetermined output impedance for said selected interface standard.

11. The method of claim 10, further comprising:
causing said programmable core to configure a programmable receiver of said programmable transceiver.

12. The method of claim 10, wherein said causing said programmable core to configure said programmable transceiver comprises:
causing said programmable core to configure said programmable transceiver to support said selected interface standard,
wherein said selected interface standard is one of a Universal Serial Bus interface standard, an IEEE 1394 interface standard and an Ethernet interface standard.

13. The method of claim 11, wherein said causing said programmable core to configure said programmable receiver comprises:
causing said programmable core to configure a programmable termination network of said programmable receiver; and
causing said programmable core to configure a clock/data recovery unit (CDRU) of said programmable receiver.

14. The method of claim 13, wherein said causing said programmable core to configure said CDRU comprises:
causing said programmable core to configure a digital-to-analog converter of said CDRU;
causing said programmable core to configure a charge pump of said CDRU;
causing said programmable core to configure a transconductance amplifier of said CDRU; and
causing said programmable core to configure a voltage-controlled oscillator of said CDRU.

15. The circuit of claim 7, wherein:
said interface standard is one of a Universal Serial Bus interface standard, an IEEE 1394 interface standard and an Ethernet interface standard.

* * * * *